(12) United States Patent
Takei et al.

(10) Patent No.: US 8,237,357 B2
(45) Date of Patent: Aug. 7, 2012

(54) METHOD FOR MANUFACTURING ORGANIC ELECTROLUMINESCENT DEVICE AND ORGANIC ELECTROLUMINESCENT DEVICE

(75) Inventors: Shuichi Takei, Shimosuwa-machi (JP); Toru Nimura, Matsumoto (JP); Masahiro Uchida, Chino (JP)

(73) Assignee: Seiko Epson Corporation, Tokyo (JP)

( * ) Notice: Subject to any disclaimer, the term of this patent is extended or adjusted under 35 U.S.C. 154(b) by 266 days.

(21) Appl. No.: 12/272,326

(22) Filed: Nov. 17, 2008

(65) Prior Publication Data
US 2009/0128020 A1 May 21, 2009

(30) Foreign Application Priority Data
Nov. 20, 2007 (JP) .................................. 2007-300198

(51) Int. Cl.
*H05B 33/00* (2006.01)
*H05B 33/10* (2006.01)
*H01J 1/62* (2006.01)
*H01J 9/00* (2006.01)

(52) U.S. Cl. .......... 313/506; 313/504; 313/512; 257/40; 445/24

(58) Field of Classification Search ........... 313/504–506
See application file for complete search history.

(56) References Cited

U.S. PATENT DOCUMENTS

| | | | |
|---|---|---|---|
| 6,784,459 B2 | 8/2004 | Seki et al. | |
| 6,861,279 B2 * | 3/2005 | Nakanishi et al. | 438/69 |
| 6,924,593 B2 | 8/2005 | Seki et al. | |
| 7,186,581 B2 | 3/2007 | Seki et al. | |
| 7,252,570 B2 * | 8/2007 | Takashima et al. | 445/24 |
| 7,459,177 B2 * | 12/2008 | Kimura et al. | 427/162 |
| 7,470,976 B2 | 12/2008 | Seki et al. | |
| 7,521,709 B2 | 4/2009 | Seki et al. | |
| 7,755,277 B2 | 7/2010 | Seki et al. | |
| 7,897,211 B2 | 3/2011 | Sakai et al. | |
| 7,990,052 B2 | 8/2011 | Seki et al. | |
| 8,128,448 B2 | 3/2012 | Seki et al. | |
| 2004/0174321 A1 * | 9/2004 | Takei | 345/45 |
| 2008/0315760 A1 | 12/2008 | Seki et al. | |

FOREIGN PATENT DOCUMENTS

| | | |
|---|---|---|
| JP | B2 3036436 | 4/2000 |
| JP | A 2002-222695 | 8/2002 |
| JP | A 2002-334782 | 11/2002 |
| JP | A 2002-372921 | 12/2002 |
| JP | A 2007-87693 | 4/2007 |
| JP | A 2007-103349 | 4/2007 |

* cited by examiner

*Primary Examiner* — Sikha Roy
(74) *Attorney, Agent, or Firm* — Oliff & Berridge, PLC (57) ABSTRACT

An organic electroluminescent device includes partition walls dividing a region into a first region, a second region and a third region, a first organic layer disposed in the first region, a second organic layer disposed in the second region, and a third organic layer disposed in the third region. The first region includes a plurality of effective pixels involved in light emission, continuously disposed along a first aligning axis. Each effective pixel includes an effective pixel electrode, a common electrode, and the first organic layer between the effective pixel electrode and the common electrode. The second region and the third region oppose each other with the first region therebetween, and the first region, the second region and the third region are aligned along the first aligning axis.

9 Claims, 9 Drawing Sheets

METHOD FOR MANUFACTURING ORGANIC ELECTROLUMINESCENT DEVICE AND ORGANIC ELECTROLUMINESCENT DEVICE

BACKGROUND

1. Technical Field

The present invention relates to a method for manufacturing an organic electroluminescent device and an organic electroluminescent device manufactured by the method.

2. Related Art

There has been developed, for example, electro-optic devices such as an organic EL display, optical writing heads such as a line head, and image-forming devices such as an optical printer, using organic electroluminescent (hereinafter referred to as organic EL) elements, which are a type of electro-optic element. An organic EL element generally has a structure including a luminescent layer made of an organic material between a pair of opposing electrodes. An organic EL device including such organic EL elements can display full color images by using red (R), green (G) and blue (B) color filters, or by using respective organic EL elements emitting those color lights.

The organic EL element is formed by different methods depending on whether the luminescent material (hereinafter referred to as organic EL material) of the organic EL element has a high molecular weight or a low molecular weight. For high-molecular-weight organic EL materials, it has been known that a so-called liquid ejection method can be applied. More specifically, an organic EL material is dissolved or dispersed in a predetermined solvent to prepare a liquid composition. The liquid composition is applied onto predetermined pixel electrodes by the liquid ejection method, thus forming organic EL elements.

The liquid ejection method allows a highly controlled minute amount of liquid composition to be applied to desired positions. Thus, the process using the liquid ejection method can advantageously form highly precise patters of organic EL materials. In addition, it is proposed for the liquid ejection method that a partition wall (bank) is formed around each pixel electrode onto which the organic EL material will be applied. Thus, the pixels are separated from each other. According to, for example, Japanese Unexamined Patent Application Publication Nos. 2002-334782 and 2002-372921 and Japanese Patent No. 3036436, the presence of the bank can prevent the liquid composition of the organic EL material applied onto a pixel electrode from mixing with the liquid composition applied onto other pixel electrodes, thus ensuring reliable patterning.

In order to reduce the current flowing to the organic EL element or in order to increase the brightness, many of the recent organic EL devices have a structure in which a plurality of organic EL elements are surrounded by a common partition wall taller than the bank so as to be divided into groups. This structure can also be formed by the liquid ejection method. More specifically, a liquid is applied to a region or group including a plurality of organic EL elements surrounded by a common partition wall by a liquid ejection method, followed by drying. Thus, the same layer is formed of the same organic EL material for the plurality of organic EL elements surrounded by the common partition wall. However, such a process causes a new problem. The applied liquid flows and moves during drying, and results in thickness variations.

The liquid ejection method for applying a liquid to a plurality of organic EL elements surrounded by a common partition wall may cause the section surrounded by the common partition wall to have a difference in dried state between the outer region, that is, the region close to the common partition wall, and the inner region. This is because the partial pressure of the solvent vapor from the liquid composition, that is, the solvent vapor concentration, around the common partition wall is lower than that in the inner region of the section surrounded by the common partition wall. Consequently, the solvent can be more rapidly dried from the outer region than the inner region. The difference in evaporation rate of the solvent causes a difference in volume between the rapidly dried region and the slowly dried region even though the liquid composition is applied to the same section in the same manner. Thus, the composition flows from the region where the solvent is not dried much to the region where the solvent is dried to reduce the volume. Consequently, the resulting layer has an uneven thickness (thickness variations). The thickness variations varies the amount of light emission, and thus leads to variations in brightness or color tone and results in display failure (inconsistencies in displayed images).

In addition, the thickness in the vicinity of the common partition wall depends on whether the common partition wall is liquid affinity or liquid repellency to the liquid composition. For example, a liquid composition close to a liquid affinity partition wall can spread over the surface of the partition wall even during drying. Accordingly, the liquid composition in the vicinity of the common partition wall rises along the side surface of the common partition wall to increase the thickness. Thus, thickness variations occur. In order to solve the above problems, Japanese Unexamined Patent Application Publication No. 2007-87693 has proposed that organic EL elements are formed apart from the common partition wall by a predetermined distance to prevent thickness variations.

The stereoscopic shape (relief shape) of the base layer underlying the region where the liquid composition is applied significantly affects the drying conditions that may cause thickness variations. Since, for example, the liquid composition is easily collected in recesses, the amount of the solvent vaporized from the liquid composition in the recesses is different from that from the composition on flat regions. When the liquid composition flows and moves during drying, how easy the liquid composition is to flow depends on the stereoscopic shape of the base layer. Consequently, the resulting layer has an uneven thickness. In addition, the flow direction of the liquid composition depends on various factors, such as the liquid affinity of the common partition wall and the volatility and evaporation drying rate of the solvent in the liquid composition, being not fixed in a specific direction. Also, it depends on the stereoscopic shape. It is therefore difficult to reduce thickness variations resulting from the flow of the liquid composition.

In the above-cited patent document, the films of the liquid composition are formed apart from the common partition wall by a specific distance or more, and the films around the partition wall are not used to eliminate the negative effect of thickness variations. However, the patent document does not propose any solution of the problem resulting from the stereoscopic shape of the base layer. Furthermore, the region distant from the common partition wall is flat, and accordingly liquid composition applied to such a flat region is liable to flow. If the distance from the common partition wall is increased to eliminate the negative effect of thickness variation in the vicinity of the common partition wall, the liquid composition becomes liable to flow and the risk of thickness variations is increased on the contrary.

SUMMARY

An advantage of some aspects of the invention is that it provides a method for manufacturing an organic EL device which prevents the thickness variations of the organic functional layer so that the resulting organic EL device can display high-quality images. Another advantage of some aspects of the invention is that it provides an organic EL device manufactured by the method.

According to an aspect of the invention, an organic electroluminescent device is provided which includes partition walls dividing a region into a first region, a second region, and a third region; a first organic layer disposed in the first region; a second organic layer disposed in the second region; and a third organic layer disposed in the third region. The first region includes a plurality of effective pixels involved in light emission, continuously disposed along a first aligning axis. Each effective pixel includes an effective pixel electrode, a common electrode, and the first organic layer between the effective pixel electrode and the common electrode. The second region and the third region oppose each other with the first region in between. The first region, the second region and the third region are aligned along the first aligning axis.

The pixel involved in light emission mentioned herein refers to a pixel emitting light used for displaying images in a display device or for a light source of a printer head.

Preferably, the first region further includes a first dummy pixel including a fourth organic layer and a second dummy pixel including a fifth organic layer that are not involved in light emission. The first dummy pixel and the second dummy pixel are disposed along the first aligning axis such that the effective pixels lie between the first dummy pixel and the second dummy pixel.

The pixel not involved in light emission mentioned herein refers to a pixel not emitting light or a pixel emitting light not used for displaying images or for a light source of a printer head.

Preferably, the first dummy pixel further includes a first dummy pixel electrode and the common electrode such that the fourth organic layer lies between the first dummy pixel electrode and the common electrode, and the second dummy pixel further includes a second dummy pixel electrode and the common electrode such that the fifth organic layer lies between the second dummy pixel electrode and the common electrode.

Preferably, the effective pixels include a first effective pixel adjacent to the first dummy pixel, a second effective pixel adjacent to the first effective pixel, and a third effective pixel adjacent to the second dummy pixel. The effective pixels and the dummy pixels are arranged at predetermined intervals, and the interval between the first dummy pixel and the first effective pixel is the same as the interval between the first effective pixel and the second effective pixel and the interval between the third effective pixel and the second dummy pixel.

The first organic layer, the second organic layer and the third organic layer may be made of the same material.

The first organic layer, the second organic layer, the third organic layer, the fourth organic layer, and the fifth organic layer may be made of the same material.

According to another aspect of the invention, a method for manufacturing an organic EL electroluminescent device is provided. In the method, a plurality of effective pixel electrodes involved in light emission is formed along a first aligning axis in a first region on a substrate. Partition walls are formed to divide a region into the first region, a second region and a third region on the substrate such that the first region, the second region and the third region are disposed along the first aligning axis and the first region lies between the second region and the third region. Organic layers are formed by depositing a liquid containing a functional material dissolved or dispersed in a solvent in the first region, on the effective pixel electrodes in the second region, and in the third region, and subsequently vaporizing the solvent. A common electrode is formed on the organic layers so as to oppose the effective pixel electrodes.

Preferably, the method further includes forming a first dummy pixel electrode and a second dummy pixel electrode that are not involved in light emission, along the first aligning axis in the first region such that the effective pixel electrodes are disposed between the first dummy pixel electrode and the second dummy pixel electrode. In forming the organic layers, the liquid is deposited on the first dummy pixel electrode and the second dummy pixel electrode as well as the effective pixel electrodes.

In the method, preferably, the effective pixel electrodes include a first effective pixel electrode adjacent to the first dummy pixel electrode, a second effective pixel electrode adjacent to the first effective pixel electrode, and a third effective pixel electrode adjacent to the second dummy pixel electrode. The effective pixel electrodes and the dummy pixel electrodes are arranged at predetermined intervals, and the interval between the first dummy pixel electrode and the first effective pixel electrode is the same as the interval between the first effective pixel electrode and the second effective pixel electrode and the interval between the third effective pixel electrode and the second dummy pixel electrode.

In forming the organic layers, the solvent instead of the liquid may be applied to the second region and the third region.

The organic electroluminescent device manufacturing method manufactures an organic electroluminescent device including a plurality of effective pixels disposed in an effective display region and a plurality of dummy pixels disposed in a dummy region around the effective display region. In the method, a plurality of conductors, a plurality of switching elements and a plurality of pixel electrodes are formed corresponding to the effective pixels and the dummy pixels in both the effective display region and the dummy region. A first partition wall is formed to surround the pixel electrodes in the effective display region and the pixel electrodes in the dummy region together. A thin film is formed of a functional material by depositing a liquid containing the functional material dissolved or dispersed in a solvent in the region surrounded by the first partition wall, and vaporizing the solvent.

If a liquid (functional liquid) containing a functional material dissolved or dispersed in a solvent is deposited in the region (first region) surrounded by the first partition wall, the thickness of the resulting film is liable to be varied in the vicinity of the first partition wall due to the wettability of the functional liquid to the first partition wall. In the above method, the dummy pixels are respectively provided at both ends of the line of the effective pixels aligned in the first region. Accordingly, the effective pixels in the first region are distant from the first partition wall by at least the width of the dummy pixel. Thus, the effective pixels are formed using the thin film (functional layer) of the functional material having a substantially uniform thickness, apart from the first partition wall without using the functional layer in the vicinity of the partition wall.

In addition, since the solvent is vaporized from the functional liquid deposited in the dummy region, the difference in vapor condition depending on the solvent vapor concentration is reduced between the effective pixels adjacent to the dummy pixels and other effective pixels. Consequently, the thickness of the resulting functional layer formed is not easily varied among the effective pixels.

Also, the dummy region to which the functional liquid will be applied has a relief shape at the surface depending on the pixel electrode, the switching element and the wiring or conductors for the dummy pixel. This relief shape at the surface stops the flow of the functional liquid. Accordingly, the thickness of the resulting functional layer is not easily varied due to the vapor condition of the solvent or the flow of the functional liquid.

Thus, the thickness of the thin film of the functional material is prevented from being varied among the effective pixels formed in the first region. Consequently, the resulting organic EL device can display superior images.

Preferably, the effective pixels and the dummy pixels are disposed at regular intervals.

Since the dummy pixels are disposed at the same intervals as the effective pixels, the relief shape formed depending on the pixel electrode, the switching element, and the wiring has certain regularity or continuity. Consequently, the vaporization of the solvent and the flow of the functional liquid become substantially uniform. Thus, the thickness variations of the resulting functional layer can be prevented.

Preferably, regions around the first partition wall are surrounded by a plurality of second partition walls before forming the functional layer, and the liquid is deposited in the regions surrounded by the second partition walls when the functional layer is formed.

By providing a larger number of dummy pixels in the first region, thickness variations can be reduced precisely because the amount of the functional liquid is increased in the dummy pixels and thus the solvent vapor concentration is increased around the effective pixels. However, a larger number of dummy pixels in the first region results in the increase of the amount of flowable functional liquid in the first region, and thickness variations are increased on the contrary. In the above method, the functional liquid is deposited in the regions (second regions) independent of the first region, surrounded by the second partition walls, and the solvent is vaporized from these regions. Thus, the solvent vapor concentration around the effective pixels can be increased without increasing the number of dummy pixels. Consequently, the functional layer can be prevented from varying in thickness without increasing the amount of functional liquid in the first region. Since the same functional liquid is deposited in the first region and the second regions, another liquid is not required for the second regions. Thus, the effective pixels can easily have a uniform thickness.

Alternatively, the solvent may be deposited in the regions surrounded by the second partition walls when functional layer is formed.

In this process, the solvent is deposited in the second regions independent of the first region, and the solvent is vaporized from the second regions. Thus, the solvent vapor concentration around the effective pixels can be efficiently increased without increasing the amount of functional liquid in the first region. Consequently, the functional layer can be more precisely prevented from varying in thickness. In this instance, a deposit is not left in the second regions after the solvent is vaporized. Even if the step of forming the functional layer is repeated, the second regions are not buried. Consequently, the solvent vapor concentration can be repeatedly controlled using the same second regions, and thus the thin films can efficiently be prevented from varying in thickness.

Preferably, the liquid or the solvent is deposited by a liquid ejection method.

The liquid ejection method can deposit a highly controlled amount of functional liquid. Accordingly, the thickness of the functional layer can be highly controlled, and the resulting functional layer has a desired thickness.

An organic EL device according to an embodiment of the invention includes a plurality of effective pixels, a plurality of dummy pixels disposed around the effective pixels, and a partition wall surrounding the effective pixels and the dummy pixels. Each effective pixel includes a pixel electrode corresponding to the effective pixel, a switching element, and a plurality of conductors. Each dummy pixel includes a pixel electrode corresponding to the dummy pixel, a dummy switching element, and a plurality of dummy conductors. The effective pixels are electrically connected to a driving circuit for controlling electrical driving signals, and the dummy pixels are electrically isolated from the driving circuit.

In this structure, the dummy pixel has the pixel electrode, the switching element and conductors as in the effective pixel. Thus, the effective pixel and the dummy pixel can be formed in the same structure and the same shape without variations resulting from the difference in structure. Also, since dummy regions not involved in displaying images are provided by forming the dummy pixels around the partition wall where display failure is liable to occur, the negative effect of the partition wall on the effective pixels can be reduced. In addition, since the dummy pixels are isolated from the driving circuit, it is ensured that the dummy pixels do not emit light or affect images displayed. Thus, the resulting organic EL device can display high-quality images.

Preferably, the dummy conductors have a discontinuous portion to ensure electrical discontinuity.

Thus, the insulation of the dummy pixels from the driving circuit can be ensured.

Preferably, the dummy pixel electrode and the dummy switching element are not electrically connected to each other.

Thus, the insulation of the dummy pixels from the driving circuit can be ensured.

Preferably, the dummy conductors and the dummy switching element are not electrically connected to each other.

Thus, the insulation of the dummy pixels from the driving circuit can be ensured.

BRIEF DESCRIPTION OF THE DRAWINGS

The invention will be described with reference to the accompanying drawings, wherein like numbers reference like elements.

DESCRIPTION OF EXEMPLARY EMBODIMENTS

A method for manufacturing an organic EL device 1 according to an embodiment of the invention will now be described with reference to FIGS. 1 to 9. For the sake of visibility, the dimensional proportions and the numbers of parts may differ as needed in each figure.

Organic EL devices are classified into two types. One is a top emission type from which light emitted from organic EL elements is extracted through the substrate opposite to the substrate on which the organic EL elements are formed. The other is a bottom emission type from which the light is extracted through the substrate on which the organic EL elements are formed. The invention can be applied to either type to produce a favorable effect, and the following description does not limit the type of organic EL device except for some factors including material.

Figure 1:
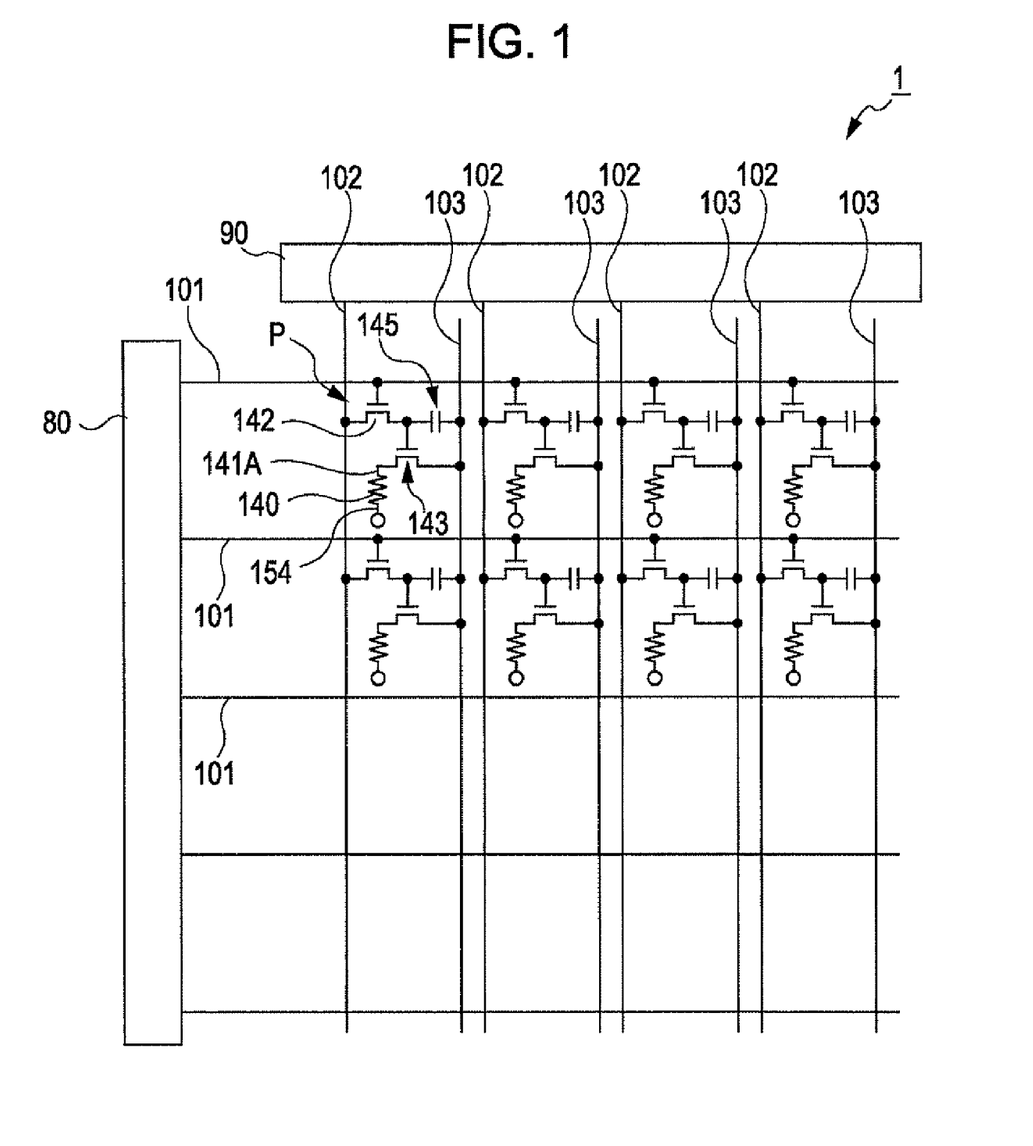
FIG. 1 is a schematic diagram of the wiring structure of an organic EL device according to an embodiment of the invention.

FIG. 1 is a schematic diagram of the wiring structure of the organic EL device 1 according to the present embodiment. The organic EL device 1 is of an active matrix type using thin-film transistors (hereinafter referred to as TFTs) as switching elements, and has a plurality of scanning lines 101, a plurality of signal lines 102 extending in the direction perpendicular to the scanning line lines 101, and a plurality of power lines 103 extending along the signal lines 102. Pixels P are formed at respective intersections of the scanning lines 101 and the signal lines 102. The invention is not, however, applied only to the active matrix type using TFTs, and can be applied to a simple matrix type. The same effect can be produced at a low cost in either type.

The scanning lines 101 are connected to a scanning line driving circuit (driving circuit) 80 including a shift register and a level shifter. The signal lines 102 are connected to a data line driving circuit (driving circuit) 90 including a shift register, a level shifter, a video line, and an analog switch.

Each pixel P includes a switching TFT (switching element) 142 having a gate electrode to which scanning signals are transmitted through the scanning line 101; a hold capacitor 145 holding a pixel signal transmitted from the signal line 102 through the switching TFT 142; a driving TFT (switching element) 143 having a gate electrode to which the pixel signal held in the hold capacitor 145 is transmitted; a pixel electrode (anode) 141A to which a driving current flows from the power line 103 when it is electrically connected to the power line 103 through the driving TFT 143; and a luminescent layer (organic luminescent layer) 140 disposed between the pixel electrode 141A and a common electrode 154. The pixel electrode 141A, the luminescent layer 140, and the common electrode 154 constitute an organic EL element 200.

When, in the organic EL device 1, the switching TFT 142 comes into an ON state by the operation of the scanning line 101, the potential of the signal line 102 at that time is held in the hold capacitor 14, and the ON/OFF state of the driving TFT 143 depends on the state of the hold capacitor 145. Current flows from the power line 103 to the pixel electrode 141A through the channel of the driving TFT 143, and further flows to common electrode 154 through the luminescent layer 140. The luminescent layer 140 emits light according to the amount of the current passing through the luminescent layer 140.

Figure 2:
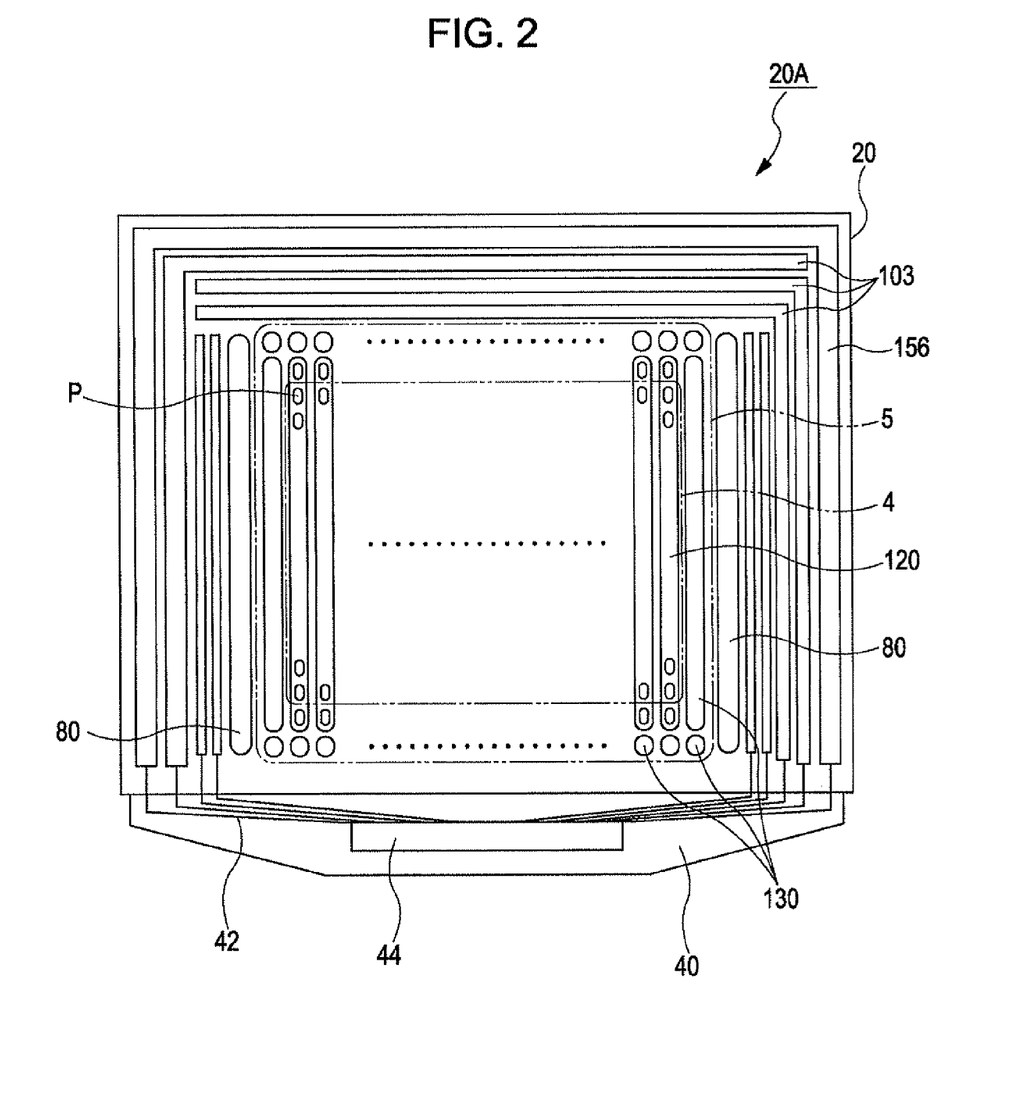
FIG. 2 is a schematic plan view of the organic EL device according to the embodiment of the invention.

The structure of the organic EL device 1 of the present embodiment will now be described in detail with reference to FIGS. 2 to 5A and 5B. FIG. 2 is a schematic plan view of the organic EL device 1.

The structure of the organic EL device will first be described with reference to FIG. 2. FIG. 2 shows a TFT element substrate (hereinafter referred to as element substrate) 20A having luminescent layers 140 emitting light with conductors TFTs, and circuits formed on a base substrate 20. The element substrate 20A of the organic EL device has an effective pixel region 4 located in the inner region of the base substrate 20 where organic EL elements 200 are arranged in a matrix manner, and a dummy region 5 (between two dotted chain lines) around the effective pixel region 4.

The dummy region 5 is surrounded by the scanning line driving circuit 80, the power lines 103, and a cathode line 156, and the like. These lines are connected to wires 42 of a flexible substrate 40 and thus connected to an integrated circuit (driving circuit) 44 disposed on the flexible substrate 40. Additional devices (not shown in FIG. 2), such as a test circuit used for quality check or defect investigation during manufacture or before shipping, may be provided if necessary.

A plurality of first regions 120, each including a plurality of organic EL elements 200 and extending across the effective pixel region 4 and the dummy region 5, are arranged. The first regions 120 have the same strip shape as each other and are arranged parallel to each other in the direction perpendicular to the direction in which the first regions 120 extend. The inner portion of the first region 120 lies in the effective pixel region 4, and the ends of the first region 120 lie in the dummy region 5. The organic EL elements 200 are disposed in the effective pixel region 4. The structure of the first region will be described later with reference to FIGS. 3A and 3B.

A plurality of second regions 130 are disposed around the arrangement of the first regions 120. More specifically, the second regions 130 are arranged at both ends of the strips of the first regions 120 and at both ends in the arranging direction of the arrangement of the first regions 120. All the second regions 130 are disposed in the dummy region 5. The structure of the second regions 130 will also be described later with reference to FIGS. 3A and 3B.

The organic EL elements 200 disposed in the first regions 120 each emit any one of red (R), green (G) and blue (B) lights. These color lights may be emitted directly from the organic EL elements 200, or white light emitted from the organic EL elements 200 may be modulated into color lights through a color filter corresponding to the X, G or B color. The organic EL device 1 of the present embodiment emits the same color light for each first region 120. Accordingly, the same color elements are disposed in the vertical direction in the figure, and thus arranged in a striped manner corresponding to the shape of the first regions 120 in the effective pixel region 4. In the effective pixel region 4, effective pixels P corresponding to the organic EL elements 200 are arranged in a matrix manner. In the effective pixel region 4, R, G and B lights emitted from the pixels P arranged in a matrix manner are mixed, and thus full color images are displayed.

The driving circuit mentioned herein refers to a general circuit including semiconductor devices and associated conductors that supply and control electrical signals for operation of the organic EL device so as to perform a specific function. In the above description, the integrated circuit 44, the scanning line driving circuit 80, and the data line driving circuit 90 belong to the driving circuit.

Figure 3A:
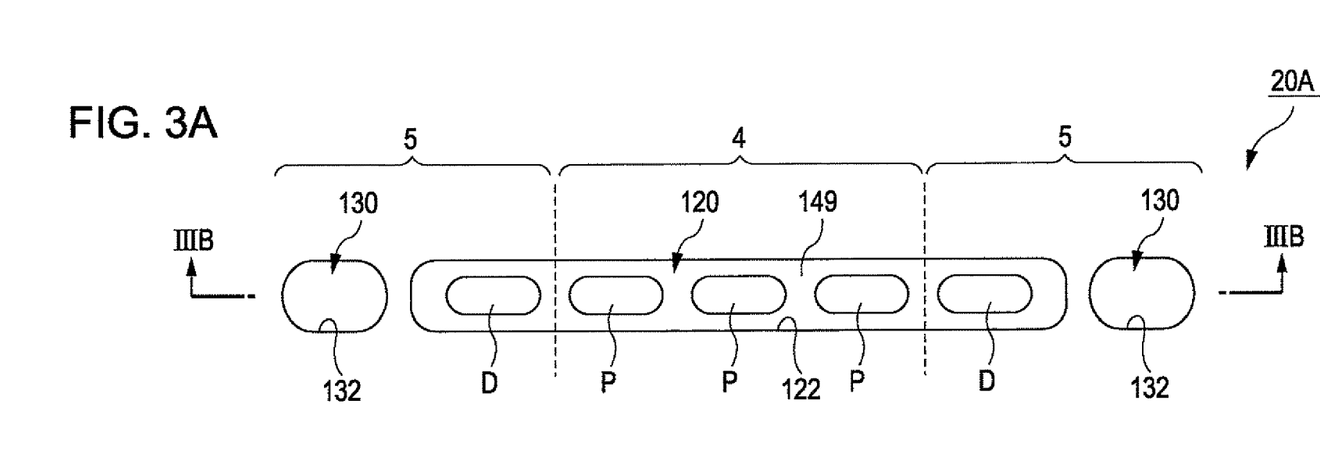
FIGS. 3A and 3B are schematically enlarged sectional views of the principal parts of the organic EL device according to the embodiment of the invention.
Figure 3B:
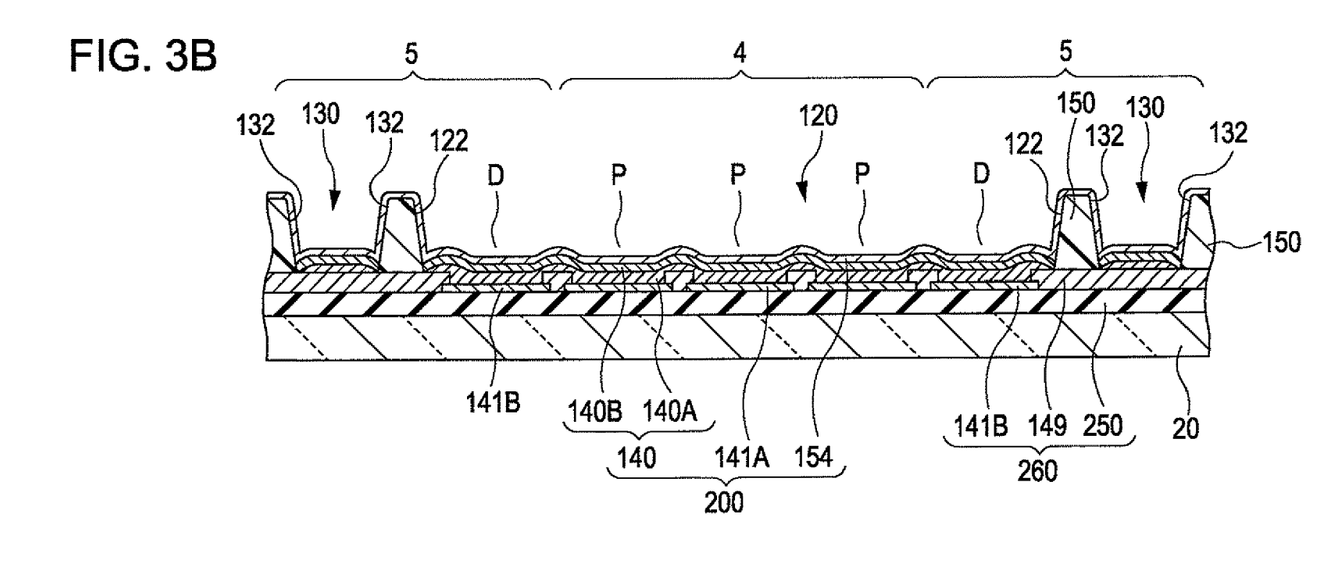

Turning now to FIGS. 3A and 3B, the first regions 120 and the second regions 130 located at both ends of the first regions 120 will now be described. FIGS. 3A and 3B show one of the first regions 120 and second regions 130 at the ends of the first region 120. FIG. 3A is a schematic plan view of those regions, and FIG. 3B is a schematic sectional view taken along ling IIIB-IIIB shown in FIG. 3A. For the sake of easy understanding, these figures show only a line of the first region 120 and the second regions 130. Although the line of the first region 120 and the second regions 130 extends in the vertical direction in FIG. 2, FIGS. 3A and 3B illustrate that the line extends in the lateral direction for the sake of visibility.

As shown in FIG. 3A, the first region 120 of the organic EL device 1 includes a plurality of effective pixels P and dummy pixels D, and these pixels P and D are surrounded by a first partition wall 122. The plurality of effective pixels P (three in FIGS. 3A and 3B) are arranged along a predetermined aligning axis, and the dummy pixels D are disposed at both ends of the arrangement of the effective pixels P. The dummy pixels D and the effective pixels P are aligned at regular intervals.

An inorganic bank layer 149 having openings corresponding to the shape of the effective pixels P and the dummy pixels D is formed in such a manner that the effective and dummy pixels P and D are separated by the inorganic bank layer 149 from each other. The effective pixels P and the dummy pixels D have the same shape in plan view. The second regions 130 are surrounded by second partition walls 132 at both ends of the length of the first region 120. The effective pixels P in the first region 120 are located in the effective pixel region 4 of the element substrate 20A, and the dummy pixels D and the second regions 130 are located in the dummy region 5 of the element substrate 20A.

As shown in FIG. 3B, element substrate 20A includes the base substrate 20, a wiring layer 250 formed on the base substrate 20 and including conductors and switching devices for operating the organic EL device 1, pixel electrodes 141A formed corresponding to the effective pixels P in the effective pixel region 4 on the wiring layer 250, pixel electrodes 141B formed corresponding to the dummy pixels D in the dummy pixel region 5 on the wiring layer 250, the inorganic bank layer 149 having the openings corresponding to the effective pixels P and dummy pixels D, and an organic bank 150 formed on the inorganic bank layer 149. Since the wiring layer 250 includes conductors and switching elements, the surface of the wiring layer 250 has a relief shape. The wiring layer 250, the pixel electrodes 141 and the inorganic bank layer 149 constitute a base layer 260 on which light-emitting portions 140 are formed, and affect the shape of the light-emitting portions 140. In the following description, the upper direction means the direction in which layers are stacked, and the lower side means the side at which the base substrate 20 is disposed.

In the region surrounded by the organic bank 150, the Light-emitting portions 140 are formed so as to cover the inorganic bank layer 149. The light-emitting portion 140 includes an hole injection layer 140A and an organic luminescent layer 140B formed in that order. Furthermore, a common electrode (cathode) 154 is formed over the entire surfaces of the light-emitting portions, covering the organic bank 150 and the organic luminescent layer 140B. The surfaces of the light-emitting portions 140 and the common electrode 154 have a relief shape (stereoscopic shape) according to the structure of the inorganic bank layer 149 and the wiring layer 250. Since the bank portions of the inorganic bank layer 149 are repeatedly disposed at regular intervals in the inner side of the first region 120, the upper surfaces of the light-emitting portions 140 and the common electrode 154 have repetitions of the same shape in a regular cycle. However, the repetition of the stereoscopic shape of the inorganic bank layer 149 is interrupted by the organic bank 150 in the outer side of the first region 120 adjacent to the organic bank 150. Accordingly the shapes of the light-emitting portion 140 and the common electrode 154 overlying the inorganic bank layer 149 are different between the inner side and the outer side of the first region 120.

The pixel electrodes 141A disposed in the effective pixel region 4, the light-emitting portions 140 and the common electrode 154 constitute organic EL elements 200 and define effective pixels P. On the other hand, the pixel electrodes 141B in the dummy region 5 are formed so as to be electrically discontinuous, and light is not emitted from the dummy region 5. Thus, the pixel electrodes 141B, the light-emitting portions 140 and the common electrode 154 in the dummy region 5 define dummy pixels D. While the second regions 130 do not have effective pixels P or dummy pixels D in the present embodiment, the dummy pixels D may be provided in the second regions 130.

Figure 4:
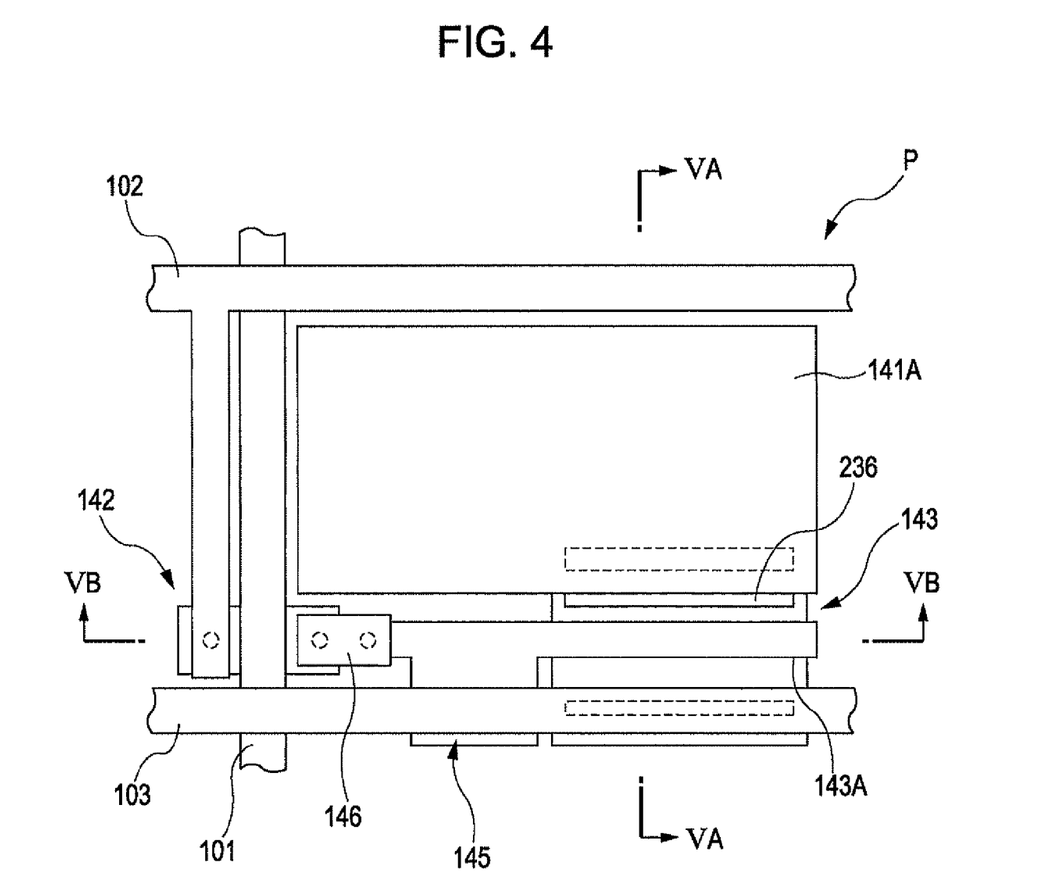
FIG. 4 is a schematic plan view of the wiring structure around an effective pixel of the organic EL device according to the embodiment.

FIG. 4 is a plan view of the wiring structure of one of the effective pixels P and its vicinity. For the sake of visibility, FIG. 4 shows only conductors and the semiconductor film, omitting the other parts.

As shown in FIG. 4, the scanning line 101 extending in the vertical direction in the figure, the power line 103 extending in the lateral direction, and the signal line 102 extending in the same lateral direction and partially diverging in the vertical direction are disposed in the vicinity of the effective pixel P. The pixel electrode 141A in a rectangular shape in plan view is disposed in the region separated by the scanning line 101, the signal line 102, and the power line 103 at three sides.

The switching TFT 142 using the scanning line 101 as the gate electrode is disposed so as not to overlap the pixel electrode 141A. The switching TFT 142 has a source electrode connected to the portion diverged from the signal line 102, and a drain electrode connected to one end of a conductor 143A with a conductor 146. The conductor 143A is formed in a strip shape, but has a rectangular protrusion with a relatively large area. The protrusion is overlapped with the power line 103 when viewed from above, and the overlap defines a hold capacitor 145. Preferably, the TFT 142 is formed so as not overlap the first region 120 when viewed from above, and the organic EL device 1 of the present embodiment has such a structure.

In addition, the driving TFT 143 using the conductor 143A as the gate electrode is disposed at the other end of the conductor 143A. The driving TFT 143 has a source electrode connected to the power line 103, and a drain electrode connected to the pixel electrode 141A with an electrode 236.

Figure 5A:
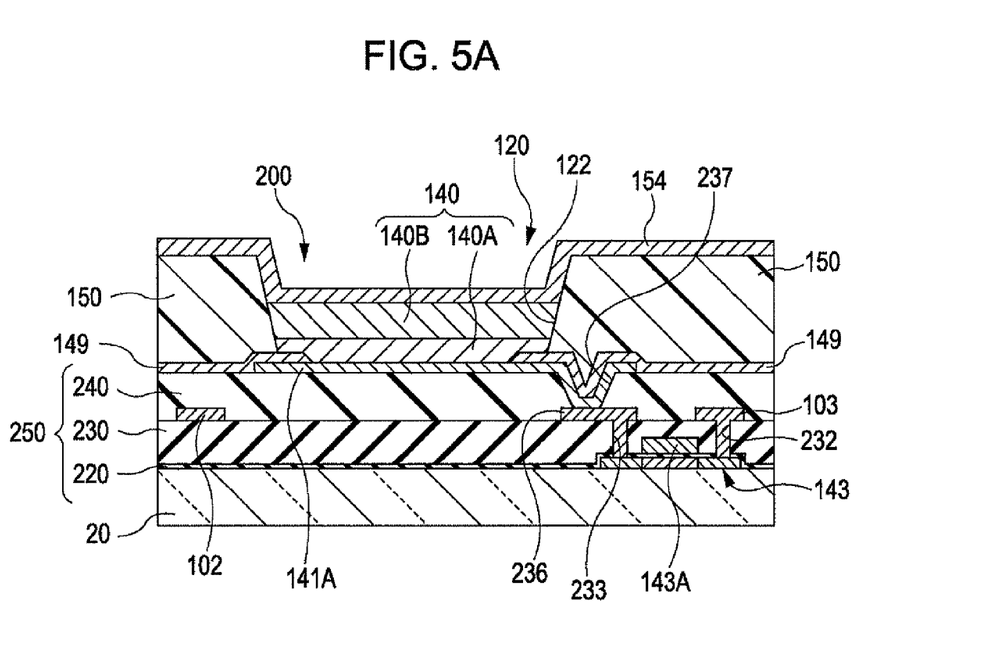
FIGS. 5A and 5B are schematic sectional views of the effective pixel and its vicinity of the organic EL device according to the embodiment.
Figure 5B:
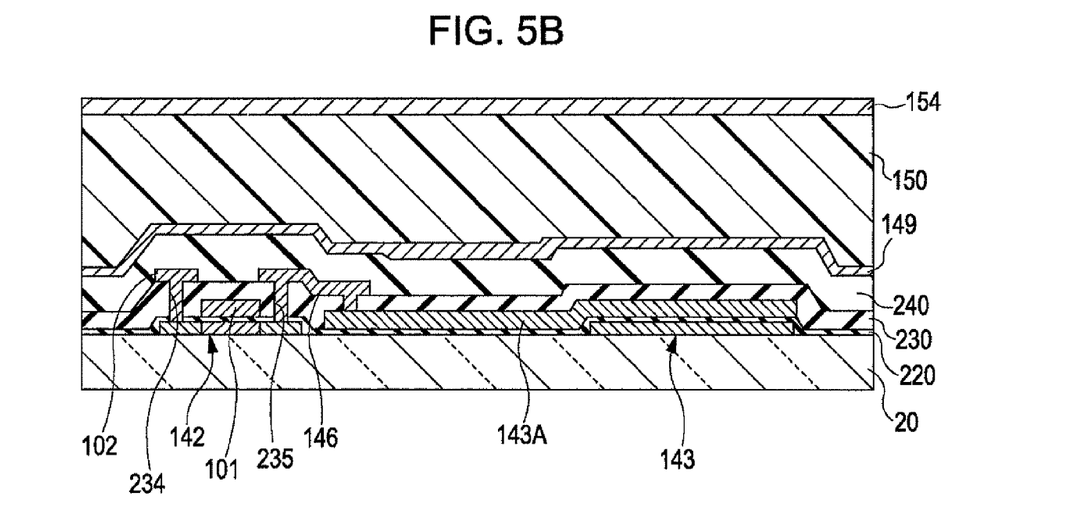

FIGS. 5A and 5B are schematic sectional views of the effective pixel P and its vicinity. FIG. 5A is a sectional view taken along line VA-VA in FIG. 4, and FIG. 5B is a sectional view taken along line VB-VB in FIG. 4. The sections shown FIGS. 5A and 5B are orthogonal to each other.

For a top emission type, the base substrate 20 is transparent. For a bottom emission type, the base substrate 20 may be transparent or opaque. The opaque substrate may be made of, for example, ceramic, such as alumina, stainless steel or other metals subjected to surface oxidation or other insulation treatment, thermosetting resin, thermoplastic resin, or their films (plastic films). The transparent substrate may be made of, for example, an inorganic material, such as glass, quartz glass, or silicon nitride, or an organic polymer (resin), such as acrylic resin or polycarbonate resin. A composite prepared by stacking or mixing these materials may be used if the composite is optically transparent. In the present embodiment, the base substrate 20 is made of glass.

The wiring layer 250 is formed over the entire surface of the substrate proper 20. The structure of the wiring layer 250 will now be described in order.

On the base substrate 20, the driving TFT 143 is formed as shown in FIG. 5A, and the switching TFT 142 is formed as shown in FIG. 5B. A gate insulating layer 220 is formed over the entire surface of the base substrate 20, covering the surfaces of these TFTs.

On the gate insulating layer 220, the conductor 143A overlaps with the gate region of the driving TFT 143, as shown in FIG. 5A, and the scanning line 101 overlaps with the gate region of the switching TFT 142, as shown in FIG. 5B. A first insulating interlayer 230 is formed over the entire surface of the gate insulating layer 220, covering the surfaces of the scanning line 101 and the conductor 143A.

The signal line 102, the power line 103, the conductor 146, and the electrode 236 are formed on the first insulating interlayer 230. The gate insulating layer 220 and the first insulating interlayer 230 are provided with a plurality of contact holes 232, 233, 234, and 235 passing through these insulating layers to reach the switching TFT 142 or the driving TFT 143. These contact holes are filled with electrodes, so that the power line 103 is connected to the source region of the driving TFT 143 and the electrode 236 is connected to the drain region of the driving TAT. The signal line 102 is connected to the source region of the switching TFT 142, and the conductor 146 is connected to the drain region of the switching TFT. These conductors and electrodes are covered with a second insulating interlayer 240 formed over the first insulating interlayer 230.

The layers from the gate insulating layer 220 to the second insulating interlayer 240 formed on the base substrate 20 are called the wiring layer 250 as a whole. Each layer constituting the wiring layer 250 and the TFTs can be formed by known methods. The insulating interlayers are made of an insulating material, such as silicon oxide, silicon nitride, or silicon nitroxide.

The pixel electrode 141A is formed on the second insulating interlayer 240. The second insulating interlayer 240 has a contact hole 237, and the part of the pixel electrode 141A formed in the contact hole 237. The pixel electrode 141A is thus electrically connected to the electrode 236, thereby being electrically connected to the driving TFT 143. The pixel electrode 141A can be made of a material having a work function of 5 eV or more. Such a material is suitable for the pixel electrode 141A because of high hole injection effect. For example, a metal oxide such as indium thin oxide (ITO) can be used for the pixel electrode 141A. In the present embodiment, ITO is used.

On the second insulating interlayer 240 and the pixel electrode 141A, the inorganic bank layer 149 is formed of an inorganic material so as to partially overlap with the outer region of the pixel electrode 141A. The inorganic bank layer 149 has openings corresponding to the effective pixels P and the dummy pixels D. Accordingly, the pixel electrodes 141A are exposed in the openings. The inorganic bank layer 149 is made of an insulating material, such as silicon oxide, silicon nitride, or silicon nitroxide. The inorganic bank layer 149 has a height of, for example, 400 nm.

The organic bank 150 is further formed of an organic material on the inorganic bank layer 149. The inorganic bank layer 149 and the organic bank 150 act as the partition walls of the organic EL device 1. A side wall of the organic bank 150 shown in FIG. 5A is act as a first partition wall 122, and the first region 120 is surrounded by the inorganic bank layer 149 and the organic bank 150. The organic bank 150 has a height of, for example, about 1 to 2 μm.

The organic bank 150 is made of an insulating resin. The organic bank 150 is preferably liquid repellency to a liquid (functional liquid) or the solvent in the liquid. The functional liquid contains a below-described functional material dissolved or dispersed in the solvent. The organic bank 150 may be formed of, for example, a photo-curable acrylic resin or a thermosetting epoxy resin, and then the surface of the organic bank 150 is subjected to liquid repellency treatment with $CF_4$ plasma. Alternatively, the organic bank 150 may be formed of a liquid repellency fluorocarbon polymer.

In the first region 120, a hole injection layer 140A, or a carrier transport layer, is formed to cover the pixel electrodes 141A and the inorganic bank layer 149. In addition, an organic luminescent layer 140B is formed on the hole injection layer 140A. The hole injection layer 140A and the organic luminescent layer 140B define the light-emitting portion 140. The hole injection layer 140A and the organic luminescent layer 140B can be made of known materials.

Exemplary hole injection layer materials include polyphenylenevinylene whose polymer precursor is polytetrahydrothiophenylphenylene, 1,1-bis-(4-N,N ditolylaminophenyl)cyclohexane, tris(8-hydroxyquinolinol) aluminum, polystyrene sulfonic acid, a mixture of polyethylenedioxythiophene and polystyrene sulfonic acid (PEDOT/PSS) and other known materials, Polar solvents may be used as the solvent, such as isopropyl alcohol, N-methylpyrrolidone, and 1,3-dimethyl-imidazolinone.

The luminescent layer can be made of known polymer luminescent materials capable of producing fluorescence or phosphorescence, and examples of such a luminescent material include polyfluorene derivatives (PF), poly(para-phenylenevinylen) derivatives (PPV), polyphenylene derivatives (PP) poly(para-phenylene) derivatives (PPP), polyvinylcarbazole (PVK), polythiophene derivatives, polydialkylfluorene (PDAF), polyfluorenebenzothiadiazole (PFBT), polyalkylthiophene (PAT), and polysilanes such as poly(methylphenylsilane) (PMPS). The luminescent material may be doped with a polymeric material, such as a perylene-based dye, a coumarin-based dye, or a rhodamine-based dye, or a low-molecular material, such as rubrene, perylene, 9,10-diphenylanthracene, tetraphenylbutadiene, nile red, coumarin 6, or guinacridone.

The common electrode 154 is formed to cover the luminescent layer 140B and the organic bank 150. The common electrode 154 covers the upper surfaces of the luminescent layer 140B and the organic bank 150 and further covers part of the side walls of the organic bank 150. The common electrode 154 can be made of a material having a work function of 4 eV or less. Such a material is suitable for the common electrode 154 because of high electron injection effect. For a top emission type, a transparent electroconductive material is selected from the materials having such a work function. While ITO is suitably used as the transparent electroconductive material, other optically transparent electroconductive materials may be used. For a bottom emission type, opaque or reflective electroconductive materials, such as aluminum, may be used in addition to the transparent electroconductive materials The common electrode 154 may be covered with a cathode protective layer. The cathode protective layer can prevent the common electrode 154 from corroding during the manufacturing process. The cathode protective layer can be made of an inorganic compound, for example, a silicon compound, such as silicon oxide, silicon nitride, or silicon nitroxide. By covering the common electrode 154 with the inorganic cathode protective layer, the common electrode 154 made of an inorganic oxide can be protected from the intrusion of oxygen or the like. The cathode protective layer is preferably formed to a thickness of about 10 to 300 nm so as to spread to the surface of the base substrate 20 outside the common electrode 154. Thus, the effective pixels P of the organic EL device 1 are formed.

The structure of the dummy pixel D is substantially the same as the effective pixel P. A difference is that the pixel electrode 141B of the dummy pixel D is not electrically connected to the driving circuit for emitting light and displaying images. Thus, the dummy pixel D has a relief shape depending on the wiring and electrodes, but ensures non-luminescence.

In order to ensure electrical discontinuity, it is easy and reliable that at least one of the contact holes to be formed for the effective pixel P is not provided for the dummy pixel. In the present embodiment, through-holes corresponding to the contact holes 233, 234, 235, and 236 are not formed for the dummy pixel D so that the pixel electrode 141B is isolated from the driving circuit.

Method for Manufacturing Organic EL Device

A method for manufacturing the organic EL device 1 will now be described with reference to FIG. 6 to FIG. 9A to 9C. The following description will particularly place emphasis on the step of forming the light-emitting portion 140. In the present embodiment, the light-emitting portions 140 are formed by depositing a functional liquid containing a functional material by a liquid ejection method. Accordingly, a liquid ejection apparatus used in the liquid ejection method will first be described with reference to FIGS. 6 and 7, and then the method for manufacturing the organic EL device 1 will be described with reference to FIGS. 8A to 9C.

Figure 6:
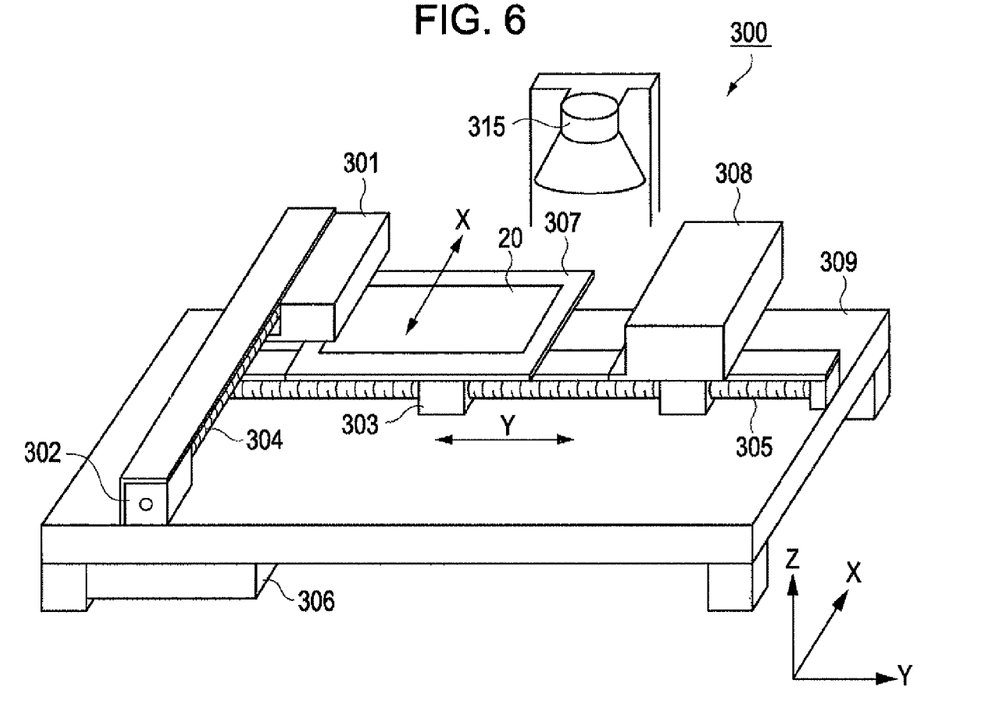
FIG. 6 is a schematic perspective view of a liquid ejection apparatus.

FIG. 6 is a schematic perspective view of a liquid ejection apparatus. In the description of the liquid ejection apparatus, positional relationships of the members or components of the apparatus will be illustrated using an XYZ rectangular coordinate system. A predetermined direction in a horizontal plane is defined as the X direction; the direction perpendicular to the X direction in the horizontal plane is defined as the Y direction; and the vertical direction to the horizontal plane is defined as the Z direction. In the present embodiment, the below-described liquid ejection head scans in the Y direction, but not in the X direction. FIG. 6 shows an exemplary structure of the liquid ejection apparatus, and the structure is not limited to that shown in the figure.

The liquid ejection apparatus 300 is intended to eject a liquid from a liquid ejection head 301 onto a substrate 20, and includes the liquid ejection head 301, and x-directional driving shaft 304, a Y-directional guide shaft 305, a controller 306, a stage, a cleaning mechanism 30S, a pedestal 309, and a heater 315.

The liquid ejection apparatus 300 supplies driving signals from the controller 306 to operate a driving mechanism (not shown), Then, the stage 307 supporting the substrate 20 moves in the X direction or the Y direction along the X directional driving shaft 304 or the Y directional guide shaft 305. The liquid ejection head 301 eject a liquid to the relatively moving substrate 20 to form a predetermined coating. In the present embodiment, the liquid is the functional liquid. The heater 315 vaporizes and dries the solvent in the functional liquid applied onto the substrate 20 to help the functional material form a thin film.

Figure 7:
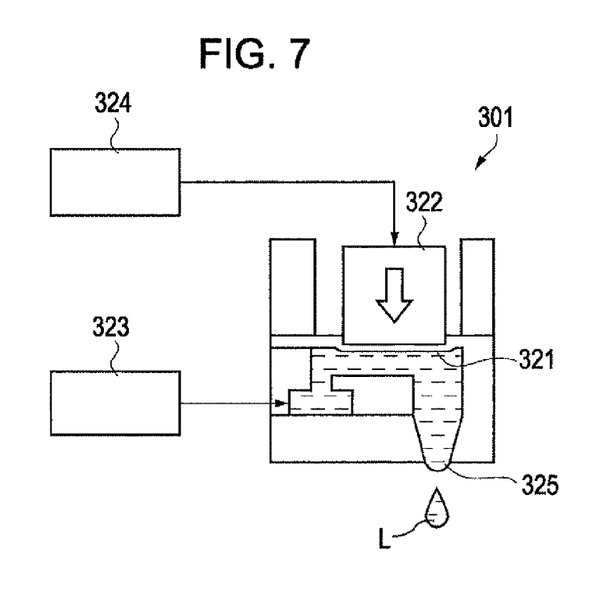
FIG. 7 is a sectional view of a liquid ejection head included in the liquid ejection apparatus.

FIG. 7 is a sectional view of a liquid ejection head 301 of the liquid ejection apparatus 300. The liquid ejection head 301 is of multi-nozzle type including a plurality of ejection nozzles. The ejection nozzles are disposed at regular intervals at the lower surface of the liquid ejection head 301. The liquid is ejected in a droplet form through the ejection nozzles. In the present embodiment, the liquid is a functional liquid in which a functional material is dissolved or dispersed. The weight of a single droplet ejected through the nozzle is, for example, 1 to 300 ng.

The liquid ejection head 301 used in the present embodiment ejects liquid by electromechanical conversion. This type of liquid ejection head has a piezoelectric element 322 adjacent to a liquid chamber 321 containing the liquid. The liquid is supplied to the liquid chamber 321 through a liquid supply system 323 including a material reservoir. The piezoelectric element 322 is connected to a driving circuit 324. A voltage is applied to the piezoelectric element 322 through the driving circuit 324 to deform the piezoelectric element 322, thereby deforming the liquid chamber 321 to increase the inner pressure. Thus, the liquid is ejected in a droplet L through the nozzle 325. The ejection amount of the liquid can be controlled by varying the applied voltage to control the deformation of the piezoelectric element 322.

Instead of the electromechanical conversion, liquid ejection may be performed by charge control, pressure and vibration, electrothermal conversion, or electrostatic suction. Any method can be favorably applied. In the charge control method, carries are applied to the material through an electrifying electrode and the material is ejected from a nozzle in a direction controlled with a deflecting electrode. In the pressure and vibration method, an ultra high pressure of, for example, 30 kg/cm$^2$ is applied to the material to eject it from the end of the nozzle. In the electrothermal conversion method, the material contained in a space is evaporated to generate bubbles by rapidly heating with a heater disposed in the space containing the material. The pressure of the bubbles ejects the material from the space. In the electrostatic suction method, a very low pressure is applied to the space containing the material to form a meniscus of the material at the nozzle. An electrostatic attraction is applied in this state to draw the material from the end of the nozzle. Other methods may be applied, including methods using changes in viscosity of fluid by applying an electric field, and scattering the material by discharge spark.

The method for manufacturing the organic EL device 1 will now be described with reference to FIGS. 8A to 9C. The procedure and material described below are just examples and are not intended to limit the invention.

Figure 8A:
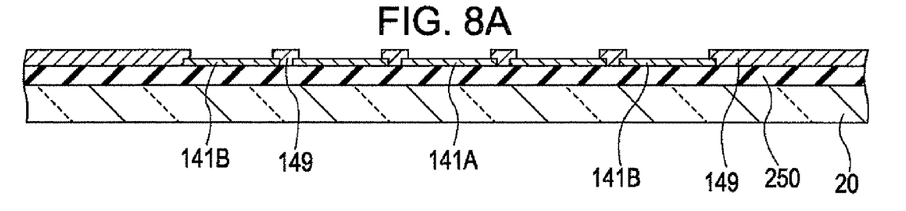
FIGS. 8A to 8D are sectional views illustrating a method for manufacturing an organic EL device according to an embodiment of the invention.

First, as shown in FIG. 8A, a base layer (including the wiring layer 250, the pixel electrodes 141A and 141B and the inorganic bank layer 149) having a relief shape depending on the wring and switching elements is formed on a base substrate 20. Specifically, after forming a wiring layer 250 by a known method, pixel electrodes 141A and 141B are formed on the wiring layer 250. Furthermore, an inorganic bank layer 149 is formed of an inorganic insulating material, such as silicon oxide, so as to overlap with the outer regions of the pixel electrodes 141A and 141B. More specifically, a silicon oxide layer is formed so as to cover the pixel electrodes 141A and 141B and the second insulating interlayer 240, and then the silicon oxide layer is patterned by a known photolithography to form openings in which the surfaces of the pixel electrodes 141A and 141B are partially exposed. The openings of the inorganic bank layer 149 are formed at regular intervals.

Figure 8B:
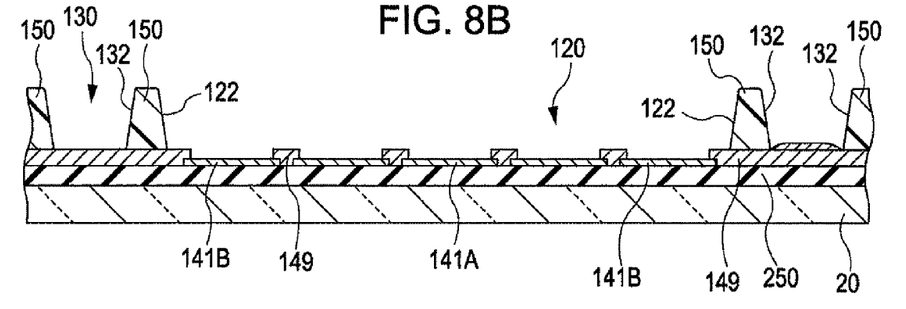

Turning now to FIG. 8B, an organic bank 150 made of fluorocarbon polymer is formed on the inorganic bank layer 149. The organic bank 150 surrounds the pixel electrodes 141 to define the first region 120. The side wall of the organic bank 150 on the first region side acts as the first partition wall 122. The organic bank 150 also surrounds other regions not overlapping with the first region 120 to define second regions 130, and the side walls of the organic bank 150 on the second region side act as second partition walls 132. The organic bank 150 between the first region 120 and the second regions 130 doubles as the first partition wall 122 and the second partition walls 132. If the organic bank 150 is made of polyimide, acrylic resin, or the like, it is preferable that the organic bank 150 be subjected to liquid repellency treatment. For the liquid repellency treatment, it is preferable that O2 plasma washing is performed to wash the pixel electrodes 141A and 141B and to apply liquid affinity treatment to the organic bank 150 before the liquid repellency treatment.

The second region 130 is not particularly limited in shape, and is required only to receive the functional liquid. However, if the second region 130 is formed wide, the dummy region 5 is increased because the second region 130 is provided in the dummy region 5 not involved in displaying images. Consequently, the effective pixel region 4 is relatively reduced. Accordingly, the second region 130 is preferably formed in appropriate dimensions and shape. Although a single second region 130 is provided at each end of the first region 120 in the present embodiment, a plurality of second regions may be provided.

Figure 8C:
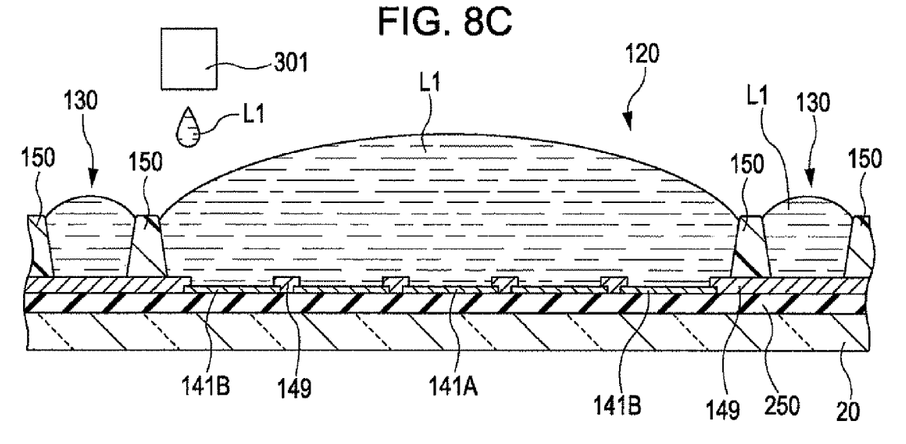

Turning now to FIG. 8C, the functional liquid L1 is applied to the first region 120 and the second regions 130 from the liquid ejection head 301. The functional liquid L1 is prepared by dissolving or dispersing a material of the hole injection layer in a solvent. The amounts of the functional liquid L1 applied to the first region 120 and the second region 130 can be independently controlled and increased or reduced as required. As an alternative to the functional liquid, the solvent of the functional liquid L1 may be applied to the second region 130. In the present embodiment, the functional liquid L1 is applied to the second region 130.

Once the functional liquid L1 is ejected from the liquid ejection head, the functional liquid L1 tends to spread in the horizontal direction. However, the organic bank 150 surrounding the region where the functional liquid L1 is applied blocks the liquid L1 from spreading to the outside. Since the organic bank 150 is liquid repellency to the functional liquid L1, the functional liquid L1 landed on the top of the organic bank 150 flows toward the first region 120 or the second region 130 and is deposited in either region.

Figure 8D:
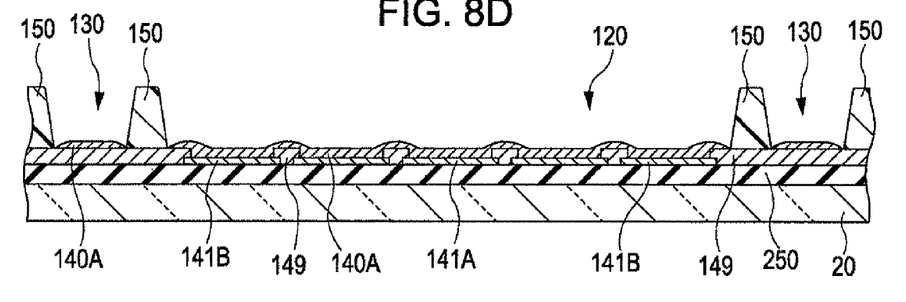

After depositing the functional liquid L1 to the first region 120 and the second regions 130, the solvent in the functional liquid L1 is vaporized by heating or irradiating light to solidify the liquid. Thus, the hole injection layer 140A is formed on the pixel electrodes 141A and 141B, as shown in FIG. 8D. Alternatively, the liquid L1 may be fired at a predetermined temperature for a predetermined time in the atmospheric conditions or in a nitrogen gas atmosphere. The liquid L1 may be placed in an environment of a pressure lower than the atmospheric pressure (under reduced pressure) to remove the solvent.

The effective pixels P and the dummy pixels D in the first region 120 are different from each other in whether the pixel electrode is electrically continuous or discontinuous, and accordingly the relief shapes at their surfaces are the same as each other. The effective pixels P and the dummy pixels D are disposed at regular intervals. Consequently, the solvent in the functional liquid L1 is vaporized from the regions of effective pixels P and the dummy pixels D under the same conditions without any difference resulting from the stereoscopic shapes at their surfaces. In addition, the relief shapes of the surfaces suppress the flow of the functional liquid L1 to prevent thickness variations of the resulting layer. Since, furthermore, the solvent is vaporized from not only the first region 120, but also the second region 130, the solvent vapor concentration around the first partition wall 122 in the first region 120 is not reduced in comparison with that of the other region. Thus, the drying rate can be the same over the first region 120. Consequently, the resulting hole injection layer 140A has the same shape as the relief shape at the surface of the base layer, and has a uniform thickness and properties.

Accordingly, it is preferable that the distance between the first region 120 and the second region 130 be small. For example, in the present embodiment, the distance is about twice as large as the distance between the effective pixels, as shown in FIG. 3A. If the distance between the first region 120 and the second region 130 is excessively large, the solvent vapor from the second region 130 cannot control the solvent vapor concentration around the first partition wall 122. The distance between the first region 120 and the second region 130 can be set according to, for example, the type of the solvent, the drying conditions in the manufacture, and the formability.

Figure 9A:
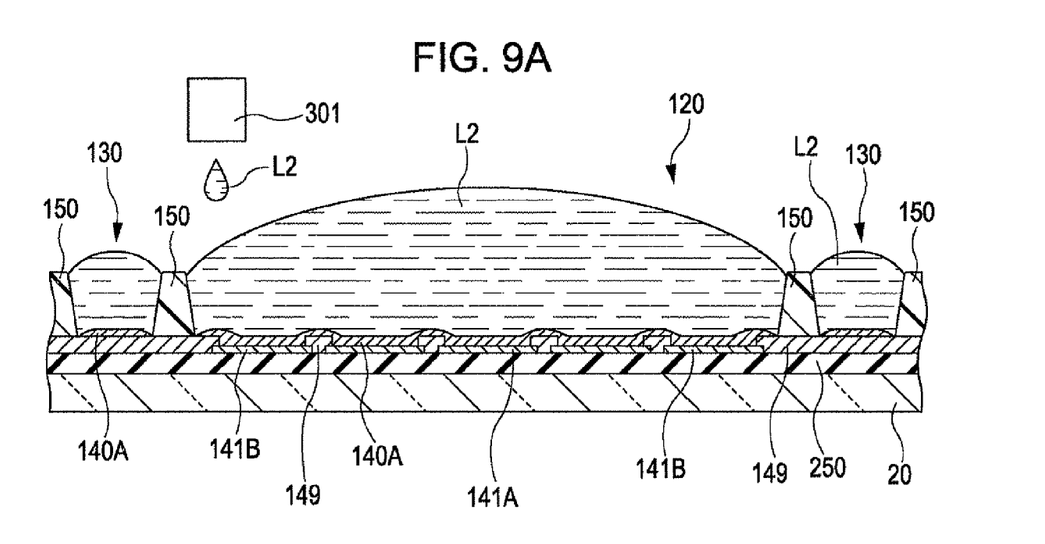
FIGS. 9A to 9C are sectional views illustrating the method for manufacturing an organic EL device.

Turning now to FIG. 9A, another functional liquid L2 is applied from the liquid ejection head 301 onto the hole injection layer 140A in the first region 120 and the hole injection layers 140A in the second regions 130. The functional liquid L2 is prepared by dissolving or dispersing a material of the organic luminescent layer in a solvent. Since the organic bank 150 is liquid repellency, the functional liquid L2 landed on the organic bank 150 is favorably deposited in the first region 120 or the second region 130 in the same manner as the functional liquid L1.

The organic luminescent layer material is dissolved or dispersed in a polar solvent, and the resulting liquid (functional liquid) is ejected from the liquid ejection head 301. Polar solvents can prevent the solid component in the functional liquid from clogging the nozzles of the liquid ejection head because polar solvents can uniformly dissolve or disperse the luminescent material.

Exemplary polar solvents include water, water-compatible alcohols, such as methanol and ethanol, N,N-dimethyl formamide (DMF), N-methylpyrrolidone (NMP), dimethyl imidazoline (DMI), dimethyl sulfoxide (DMSO), and 2,3-dihydrobenzofuran. These solvents may be used singly or in combination. In order to adjust the viscosity, cyclohexylbenzene or the like may be added to the solvent.

If the organic luminescent layer 140B emit red, green and blue colors, the organic luminescent layer 140B is formed by ejecting different functional liquids containing a luminescent layer material emitting red light, green light or blue light to their respective first regions 120. If the organic luminescent layer 140B emits white light, organic luminescent layers emitting red, green and blue color lights may be formed in the same first region to form a three-layer structure so that white light can be extracted by simultaneously emitting those three color lights.

Figure 9B:
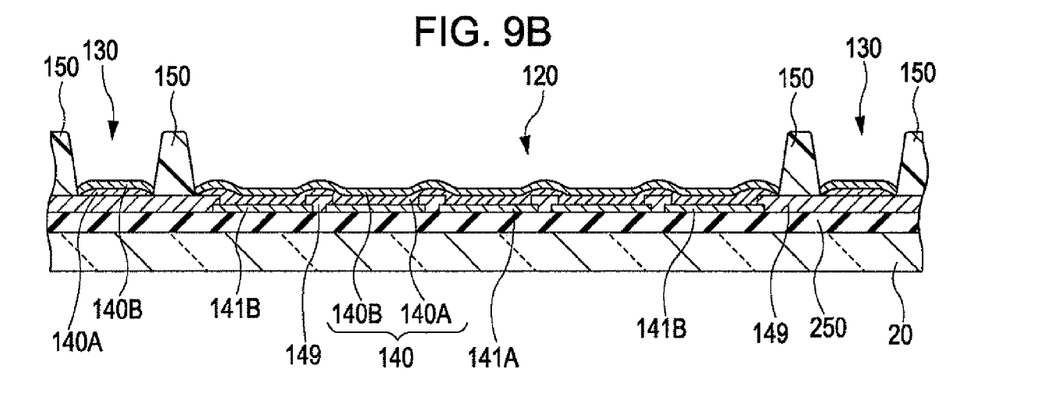

Then, the functional liquid L2 is dried to remove the solvent, as shown in FIG. 9B. Thus, the solid organic luminescent layer 140B is formed on the hole injection layer 140A corresponding to three colors, and the hole injection layer 140A and the organic luminescent layer 140B define a light-emitting portion 140.

Since, in this instance, the functional liquid L2 is applied to the second region 130 as well as the first region as in the formation of the hole injection layer 140A, the solvent vapor concentration around the first partition wall 122 of the first region 120 is not reduced in comparison with that of the other region. Thus, the drying rate can be the same over the first region 120. Since the surface of the hole injection layer 140A onto which the functional liquid L2 is applied is favorably even, the luminescent layer 140B formed on the hole injection layer 140A can also be favorably even. Consequently, the resulting organic luminescent layer 140B can exhibit uniform, satisfying luminescent characteristics and can be reliable.

Figure 9C:
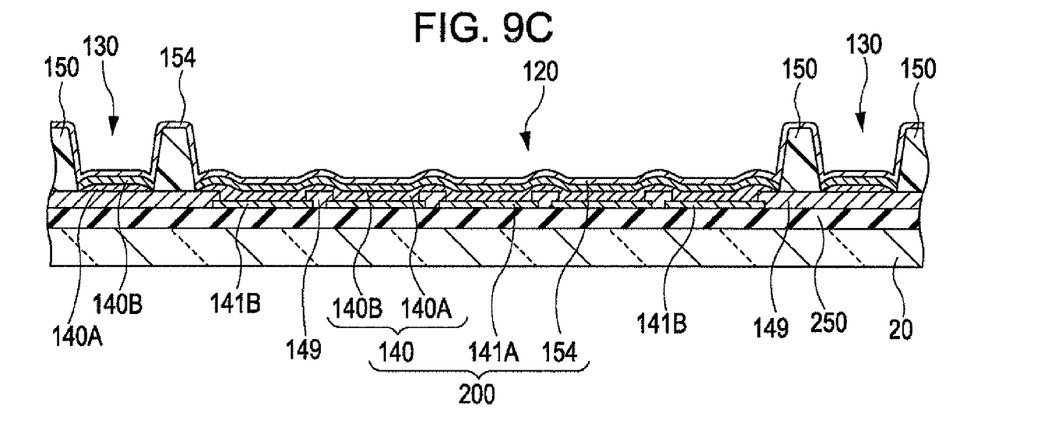

After forming the organic luminescent layers 140B in all the first regions 120, a common electrode 154 is formed of ITO or the like over the entire surface of the base substrate 20, covering the organic luminescent layers 140B and the organic bank 150, as shown in FIG. 9C. The common electrode 154 may be formed by physical vapor deposition, such as sputtering, or by chemical vapor deposition (CVD). A protective layer may be provided with the surface of the common electrode 154 to prevent the breakage of the common electrode 154, if necessary. Thus, the organic EL elements 200 are formed and, thus, the organic EL device 1 is completed.

In the manufacturing method of the organic EL device 1, the dummy pixels D having the same structure and the same shape as the effective pixels P are formed in the first region 120. The presence of the dummy pixels D prevents thickness variations of the functional layers, such as the hole injection layer 140A and the organic luminescent layer 140B, among the effective pixels P formed in the first region 120. Consequently, the resulting organic EL device can display high-quality images.

In the present embodiment, the effective pixels P and the dummy pixels D are disposed at regular intervals. Accordingly, the surface onto which functional liquid is applied has periodical, continuous relief shape depending on the pixel electrodes, the switching elements, the wiring, or the like. Consequently, the vaporization of the solvent and the flow of the functional liquid become substantially uniform. Thus, thickness variations of the functional layer can be reduced.

In the present embodiment, the second regions 130 surrounded by the second partition walls 132 are provided around the first region 120, and the functional liquid is applied to the second regions 130 as well as the first region. Since the solvent is vaporized from the functional liquid in the second region 130, the solvent vapor concentration around the first region 120 can be increased without increasing the number of the dummy pixels D in the first region 120. Thus, thickness variations can be reduced precisely. Since the second regions 130 are coated with the same functional liquids as the first region 120, the coating of the functional liquid can be easily performed to prevent the thickness variations.

In the present embodiment, functional liquids are applied by a liquid ejection method. Therefore the amount of the liquid can be precisely controlled to form the functional layer to a desired thickness.

Also, since the dummy pixel D has the same pixel electrode, switching element, and conductors as the effective pixel P, the effective pixel P and the dummy pixel D have the same structure and the same shape. Thus, variations resulting from the difference in structure can be eliminated between the effective pixel P and the dummy pixel D. Also, since the dummy regions 5 not involved in displaying images (emitting light) are provided by forming the dummy pixels D around the partition wall around which display failure is liable to occur, the negative effect of the partition wall on the effective pixels P can be reduced. In addition, since the dummy pixels D are isolated from the driving circuit, it is ensured that the dummy pixels D do not emit light or affect images displayed. Thus, the resulting organic EL device 1 can display high-quality images.

In the dummy pixel of the preset embodiment, the contact holes 233, 234, 235, and 236 for connecting the conductors or a conductor with the switching element are not formed to be electrically discontinuous. Thus, the insulation of the dummy pixel D from the driving circuit can be ensured.

While the contact holes 233, 234, 235, and 236 are not formed in the present embodiment, the dummy pixel may be isolated from the driving circuit by eliminating the contact hole 237 so that the switching element and the pixel electrode are electrically discontinuous.

While the contact holes connected to the pixel electrode 141B are not formed so that the pixel electrode 141B of the dummy pixel D is electrically discontinuous in the present embodiment, the dummy pixel D may be isolated by forming discontinuous wiring for the dummy pixel D. Alternatively, the effective pixel P and the dummy pixel D may be formed in the same manner, but the circuit is configured so that signals are not supplied to the dummy pixel D.

While the same functional liquid is applied to the first region 120 and the second region 130 in the present embodiment, only the solvent used in the functional liquid may be applied to the second region 130 to control the solvent vapor concentration. In this instance, a deposit is not left in the second region 130 after the solvent is vaporized. Even if the coating of the liquid is repeated several times, the second region 130 is not buried. Consequently, the solvent vapor concentration can be repeatedly controlled using the same second region 130, and thus the thickness variations can be efficiently reduced. The solvent can also be applied by a liquid ejection method. The liquid ejection method can easily control the amount of solvent to be applied.

While the functional liquid is applied by a liquid ejection method in the present embodiment, other wet methods, such as screen printing, gravure printing, flexography, and a dispenser method, can be applied for forming the functional layers.

While the organic EL device 1 of the present embodiment is an image display device including organic EL elements that displays full color images, the method of the present embodiment can be applied to other types of organic EL device. For example, the method of the present embodiment can produce a light source of an exposure head of an optical printer being a type of image-forming device. In this instance, the organic EL element emits white light, not using color filters. By use of an exposure head including such a light source, high-resolution optical printer can be achieved.

Electronic Apparatus

Electronic apparatuses including the organic EL device of the above embodiment will now be described with reference to FIGS. 10A to 10C.

Figure 10A:
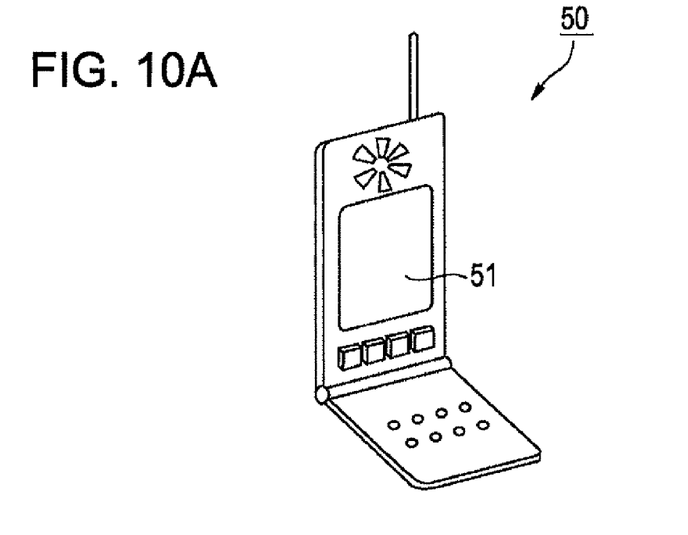
FIGS. 10A to 10C are representations of electronic apparatuses including an organic EL device according to an embodiment of the invention.

FIG. 10A is a perspective view of a cellular phone. As shown in FIG. 10A, the cellular phone 50 includes a display portion 51. The display portion 51 includes an organic EL device according to the invention.

Figure 10B:
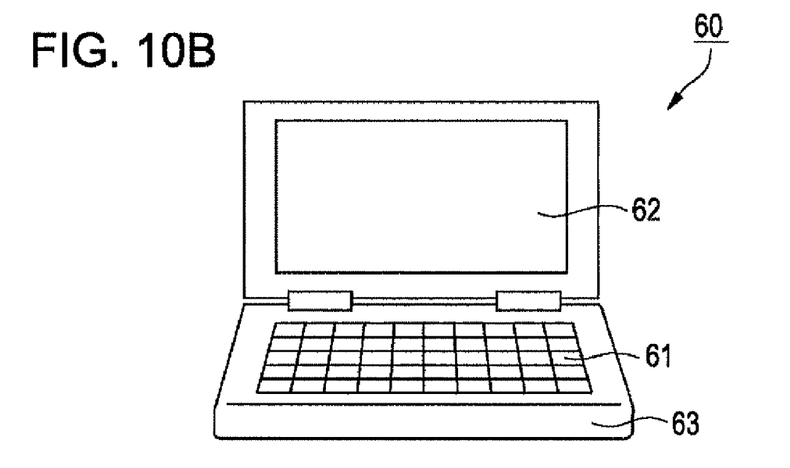

FIG. 10B is a perspective view of a mobile information processing apparatus, such as a word processer or a personal computer. As shown in FIG. 10B, the information processing apparatus 60 includes an input portion 61, such as a key board, a display portion 62, and a body 63. The display portion 62 includes an organic EL device according to the invention.

Figure 10C:
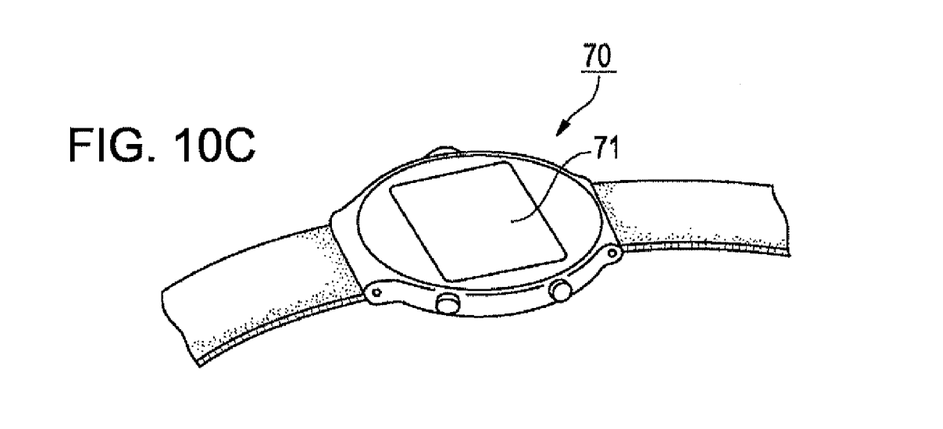

FIG. 10C is a perspective view of a wrist watch type electronic apparatus. As shown in FIG. 10C, the wrist watch type electronic apparatus 70 includes a display portion 71. The display portion 71 includes an organic EL device according to the invention.

Since the electronic apparatuses shown in FIG. 10A to 10C include the organic EL device described above, high-quality images can be displayed with display failure reduced and the lifetime is long.

The organic EL device of the invention can be applied to a variety of electronic apparatuses without limiting to those apparatuses. For example, the organic EL device can be applied to desktop computers, liquid crystal projectors, multimedia-equipped personal computers (PSs) and engineering work stations (EWS), pagers, word processors, television sets, viewfinder-type or monitor-direct-view-type video tape recorders, electronic notebooks, electronic calculators, car navigation systems, POS terminals, touch panel-equipped devices, and other electronic apparatuses.

While the invention has been described with reference to preferred embodiments and associated drawings, it is to be understood that the invention is not limited to the disclosed preferred embodiments. The parts, shapes, and combinations used in the embodiments are just examples, and various modifications may be made without departing from the scope and spirit of the invention.

The entire disclosure of Japanese Patent Application No. 2007-300198, filed Nov. 20, 2007 is expressly incorporated by reference herein.

What is claimed is:

1. An organic electroluminescent device comprising:
    partition walls dividing a region into a first region, a second region, and a third region;
    a first organic layer disposed in the first region;
    a second organic layer disposed in the second region; and
    a third organic layer disposed in the third region,
    the first region including:
        a plurality of effective pixels involved in light emission, continuously disposed along a first aligning axis and not separated by partition walls, each effective pixel including an effective pixel electrode, a common electrode, and the first organic layer between the effective pixel electrode and the common electrode;
        a first dummy pixel including a fourth organic layer and a second dummy pixel including a fifth organic layer that are not involved in light emission and are disposed along the first aligning axis such that the effective pixels lie between the first dummy pixel and the second dummy pixel; and
        an inorganic bank layer having openings corresponding to shapes of the plurality of effective pixels and the first and second dummy pixels, the inorganic bank layer separating the plurality of effective pixels and the first and second dummy pixels,
    where the second region and the third region oppose each other with the first region therebetween, and the first region, the second region and the third region are aligned along the first aligning axis.

2. The organic electroluminescent device according to claim 1, wherein the first dummy pixel further includes a first dummy pixel electrode and the common electrode such that the fourth organic layer lies between first dummy pixel electrode and the common electrode, and the second dummy pixel further includes a second dummy pixel electrode and the common electrode such that the fifth organic layer lies between the second dummy pixel electrode and the common electrode.

3. The organic electroluminescent device according to claim 1, wherein the effective pixels include a first effective pixel adjacent to the first dummy pixel, a second effective pixel adjacent to the first effective pixel, and a third effective pixel adjacent to the second dummy pixel, and wherein the effective pixels and the dummy pixels are arranged at predetermined intervals, and the interval between the first dummy pixel and the first effective pixel is the same as the interval between the first effective pixel and the second effective pixel and the interval between the third effective pixel and the second dummy pixel.

4. The organic electroluminescent device according to claim 1, wherein the first organic layer, the second organic layer and the third organic layer are made of the same material.

5. The organic electroluminescent device according to claim 1, wherein the first organic layer, the second organic layer, the third organic layer, the fourth organic layer, and the fifth organic layer are made of the same material.

6. The organic electroluminescent device according to claim 1, wherein the first organic layer is disposed directly on the inorganic bank layer such that a surface of the first organic layer has a relief shape corresponding to the inorganic bank layer.

7. A method for manufacturing an organic electroluminescent device, comprising:
    forming a plurality of effective pixel electrodes involved in light emission along a first aligning axis in a first region on a substrate;
    forming partition walls dividing a region into the first region, a second region and a third region on the substrate such that the first region, the second region and the third region are disposed along the first aligning axis, the first region lies between the second region and the third region, and the plurality of effective pixel electrodes in the first region are not separated by partition walls;
    forming organic layers by depositing a liquid containing a functional material dissolved or dispersed in a solvent in the first region, in the second region on the effective pixel electrodes, and in the third region, and subsequently vaporizing the solvent;
    forming a first dummy pixel electrode and a second dummy pixel electrode that are not involved in light emission, along the first aligning axis in the first region such that the effective pixel electrodes are disposed between the first dummy pixel electrode and the second dummy pixel electrode, wherein in forming the organic layers, the liquid is deposited on the first dummy pixel electrode and the second dummy pixel electrode as well as the effective pixel electrodes;
    forming an inorganic bank layer having openings corresponding to shapes of the plurality of effective pixel electrodes and the first and second dummy pixel electrodes, the inorganic bank layer separating the plurality of effective pixel electrodes and the first and second dummy pixel electrodes; and
    forming a common electrode on the organic layers so as to oppose the effective pixel electrodes.

8. The method according to claim 7, wherein the effective pixel electrodes include a first effective pixel electrode adjacent to the first dummy pixel electrode, a second effective pixel electrode adjacent to the first effective pixel electrode, and a third effective pixel electrode adjacent to the second dummy pixel electrode, and wherein the effective pixel electrodes and the dummy pixel electrodes are arranged at predetermined intervals, and the interval between the first dummy pixel electrode and the first effective pixel electrode is the same as the interval between the first effective pixel electrode and the second effective pixel electrode and the interval between the third effective pixel electrode and the second dummy pixel electrode.

9. The method according to claim 7, wherein in forming the organic layers, the solvent instead of the liquid is applied to the second region and the third region.

* * * * *